United States Patent
Subrahmanyam et al.

(10) Patent No.: US 6,801,402 B1
(45) Date of Patent: Oct. 5, 2004

(54) ESD-PROTECTED HEAD GIMBAL ASSEMBLY FOR USE IN A DISK DRIVE

(75) Inventors: Jai N. Subrahmanyam, Santa Clara, CA (US); Darrell D. Palmer, San Jose, CA (US); Jack M. Chue, Los Altos, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 120 days.

(21) Appl. No.: 10/286,170

(22) Filed: Oct. 31, 2002

(51) Int. Cl.⁷ .............................. G11B 5/40; G11B 5/48
(52) U.S. Cl. .................................... 360/245.9; 360/323
(58) Field of Search ........................... 360/245.9, 246, 360/264.2, 266.3, 323; 174/254

(56) References Cited

U.S. PATENT DOCUMENTS

| | | | |
|---|---|---|---|
| 5,680,274 A | * 10/1997 | Palmer | 360/245.9 |
| 6,075,676 A | * 6/2000 | Hiraoka et al. | 360/264.2 |
| 6,125,015 A | * 9/2000 | Carlson et al. | 360/245.9 |
| 6,163,443 A | * 12/2000 | Hatagami et al. | 360/323 |
| 6,459,043 B1 | * 10/2002 | Dodsworth | 174/254 |
| 2002/0154454 A1 | * 10/2002 | Kupinski et al. | 360/323 |

OTHER PUBLICATIONS

"TSA Suspension Application Guide" From Hutchinson Technology Inc. Published Sep. 18, 1998, Updated Sep. 10, 1999, Sep. 8, 2000 and Sep. 7, 2001.
Brian Thornton & Mark Tanaka, Read-Rite Corp.; "FSA vs TSA", Insight Magazine Article pp. 28–30;, Spring 2002.
Anti-Static Coating (AS–21), Preliminary Data Sheet; pp. 1–4; Hutchinson Technology, Sep. 9, 2002 (draft copy).

* cited by examiner

*Primary Examiner*—David Ometz
(74) *Attorney, Agent, or Firm*—Milad G. Shara, Esq.; Ramin Mobarhan, Esq.

(57) ABSTRACT

A Head Gimbal Assembly (HGA) for use in a disk drive and further includes a head having a read element and a write element; and a Trace Gimbal Assembly (TGA) attached to the head. The TGA includes a conductor array having a first end connected to the read element and the write element and a distal end for connecting the read element and the write element to a signal processing circuit, a conductive substrate supporting the head and the conductor array and a dielectric layer disposed between the conductor array and the conductive substrate. The TGA further includes a shunt connected at the distal end for shunting the read element; and an anti-static coating, covering a substantial portion of the conductor array for neutralizing electrostatic charge accumulation on the conductor array.

33 Claims, 9 Drawing Sheets

View A–A

FIGURE 3A

View A–A

FIGURE 3B

View A–A

ESD-PROTECTED HEAD GIMBAL ASSEMBLY FOR USE IN A DISK DRIVE

FIELD OF THE INVENITON

The present invention relates to a head gimbal assembly used in disk drives. More particularly, this invention pertains to a head gimbal assembly having features for improved ESD protection.

BACKGROUND OF THE INVENTION

Disk drives are commonly employed in workstations, personal computers, portables and other computer systems to store large amounts of data in a readily-available form. Typically, the primary components of a disk drive are a head disk assembly and a printed circuit board assembly which when fixed to one another form a functional unit that is then connected to a computer, such as by insertion into a bay of a host computer.

The head disk assembly includes a base and a cover which collectively house an actuator arrangement, driven by a voice coil motor and comprising a head stack assembly, and at least one data storage disk mounted on a spindle motor for rotating the storage disk. The head stack assembly comprises one or more head gimbal assemblies, each comprising a head or "slider" connected to a trace gimbal assembly having pairs of read and write traces for connecting the head to the printed circuit board assembly. The trace gimbal assembly is typically mounted to a conductive substrate such as a load beam for supporting the read and write traces and the head.

In current disk drives, head read elements are formed with Giant Magnetoresistive (GMR) elements which are being continually driven to smaller geometries to be compatible with increasing track densities required to meet capacity targets. Unfortunately, the diminishing size of the heads have made them increasingly vulnerable to electrostatic discharges (ESD) during the various stages of the manufacturing process, particularly during the pre-head disk assembly stages. Because of the small physical size of today's heads, very low discharge levels can be more than sufficient to destroy the head.

The head is also susceptible to damages caused by electrical overstress (EOS) events which typically occur at even lower potential differences than those causing an ESD event. Additionally, damages caused by ESD and EOS events can be hard to detect prior to the final assembly and testing of the disk drive, at which time replacing and repairing of the damaged head proves to be the most expensive and can cause reliability problems due to an overstressed head. It is therefore highly desirable to prevent ESD and EOS events from occurring during all stages of the manufacturing of the head stack assembly.

Currently, one form of reducing the occurrence of ESD and EOS events is by use of a shunt to short circuit the read element in the head. The shunt approach is not without shortcomings. One shortcoming of the shunt is that although the shunt protects the head against the occurrence of ESD and EOS events, it also virtually precludes testing the shunted element. To address this problem, a switched shunt has been used which can be set to an open position while testing of the read element and then closed to a short-circuit position at other times. In common practice, a switched shunt is placed at a distal end of the trace gimbal assembly so that it can be removed prior to the final integration of the head gimbal assembly into the head stack assembly. This distancing, however, diminishes the effectiveness of the shunt in protecting the head.

Another currently utilized form of reducing the occurrence of ESD and EOS events is by use of an anti-static coating applied on the head gimbal assembly. The anti-static coating functions to dissipate the accumulated charge thereby reducing the occurrence of ESD and EOS events. The use of anti-static coating, however, is not without shortcomings. The anti-static coating cannot be applied to all regions of the trace gimbal assembly due to non-ESD and EOS related mechanical and chemical considerations. For example, if too thick an anti-static coating is applied it may cause adverse stiffness in the gimbal area. If too little anti-static coating is applied, it may not sufficiently adhere to head gimbal assembly and become detached during the operation of the disk drive.

Accordingly, what is needed is a head gimbal assembly that has reduced susceptibility to ESD and EOS events.

SUMMARY OF THE INVENTION

This invention can be regarded as a Trace Gimbal Assembly (TGA) for use in a disk drive, wherein the TGA is attachable to a head having a read element and a write element. The TGA includes a conductor array having a first end connectable to the read element and the write element and a distal end for connecting the read element and the write element to a signal processing circuit. A conductive substrate supports the head and the conductor array. A dielectric layer is disposed between the conductor array and the conductive substrate. The TGA further includes a shunt connected at the distal end for shunting the read element; and an anti-static coating, covering a substantial portion of the conductor array for neutralizing electrostatic charge accumulation on the conductor array.

This invention can also be regarded as a Head Gimbal Assembly (HGA) for use in a disk drive. The HGA includes a head having a read element and a write element; and a Trace Gimbal Assembly (TGA) attached to the head. The TGA includes a conductor array having a first end connected to the read element and the write element and a distal end for connecting the read element and the write element to a signal processing circuit, a conductive substrate supporting the head and the conductor array and a dielectric layer disposed between the conductor array and the conductive substrate. The TGA further includes a shunt connected at the distal end for shunting the read element; and an anti-static coating, covering a substantial portion of the conductor array for neutralizing electrostatic charge accumulation on the conductor array.

DETAILED DESCRIPTION OF THE INVENTION

Figure 1:
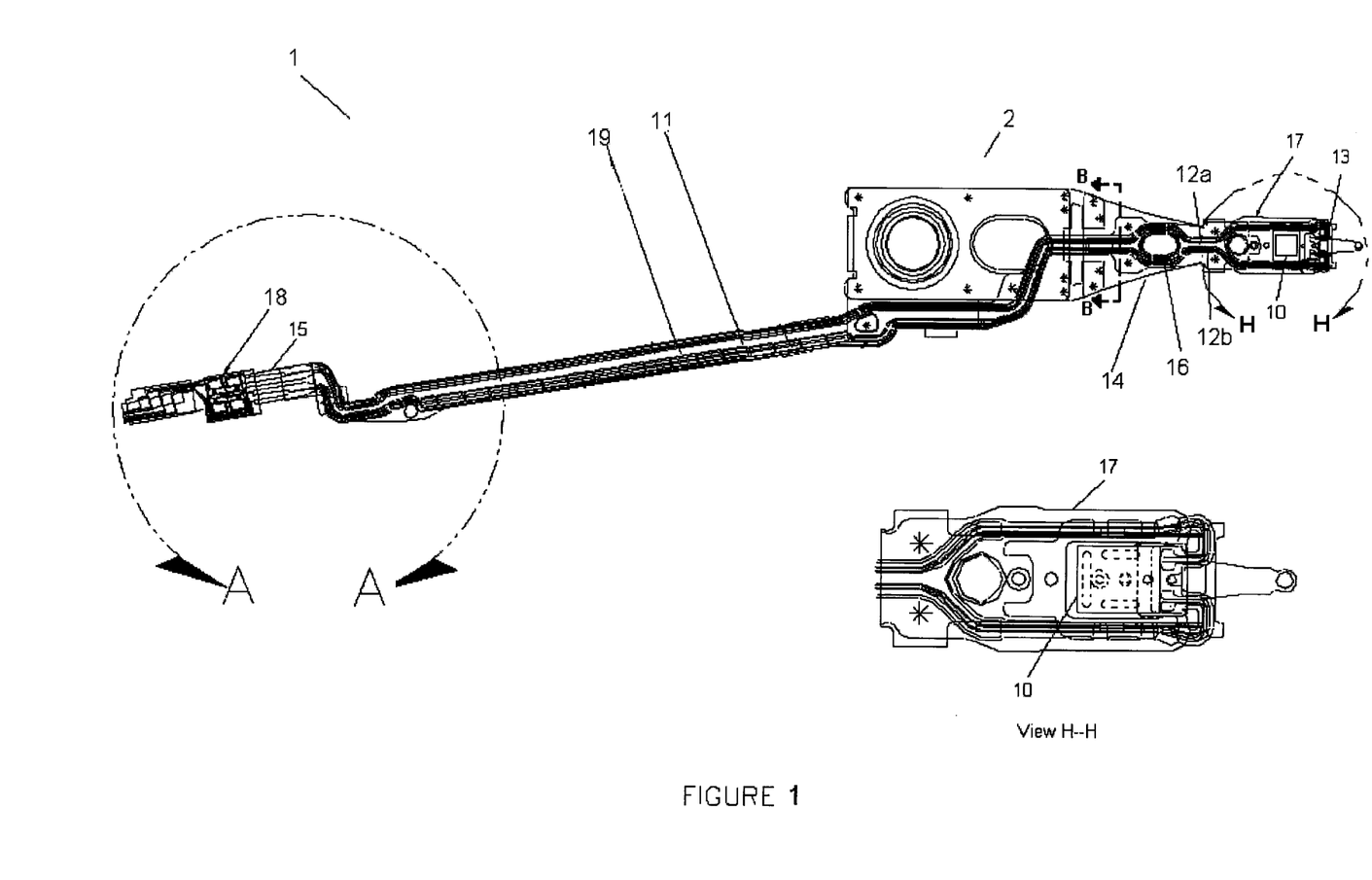
FIG. 1 is a top plan view of a Head Gimbal Assembly having a shunt and an anti-static coating for neutralizing electrostatic charge accumulation.

With reference to FIG. 1, a Head Gimbal Assembly (HGA) 1 according to a preferred embodiment of the present invention for use in a disk drive includes a head 10 having a read element and a write element (not shown), and a Trace Gimbal Assembly (TGA) 2 attached to the head 10. In the preferred embodiment, the head 10 is mounted on a gimbal 17 as also shown in the magnified view H—H of the area defined by line H—H in FIG. 1, wherein portions of gimbal 17 underneath head 10 appear in phantom. The TGA 2 includes a conductor array 11 having a first end 13 connected to the head 10 at the read element and the write element and a distal end 15 for connecting the read element and the write element to a signal processing circuit, such as a pre-amplifier circuit (not shown). The TGA 2 further includes a conductive substrate 14 for supporting the head 10 and the conductor array 11. In a preferred embodiment, the conductive substrate 14 is a load beam. The TGA 2 further includes a dielectric layer 16 disposed between the conductor array 11 and the conductive substrate 14; and a shunt 18 connected at the distal end 15 for shunting the read element. In the preferred embodiment of the present invention the conductor array 11 is a pair of read-paths 12*a* connected to the read element for electrically connecting the head to the shunt 18, and a pair of write-paths 12*b* connected to the write element. The TGA 2 further includes an anti-static coating 19, covering a substantial portion of the conductor array 11 for neutralizing electrostatic charge accumulation on the conductor array 11. The anti-static coating 19 substantially covers at least one of the pairs 12*a* and 12*b*. In the preferred embodiment of the present invention, the anti-static coating 19 is a low resistivity dielectric coating characterized by a resistance in the range of 10 kilo-ohms to 100 kilo-ohms.

Figure 2A:
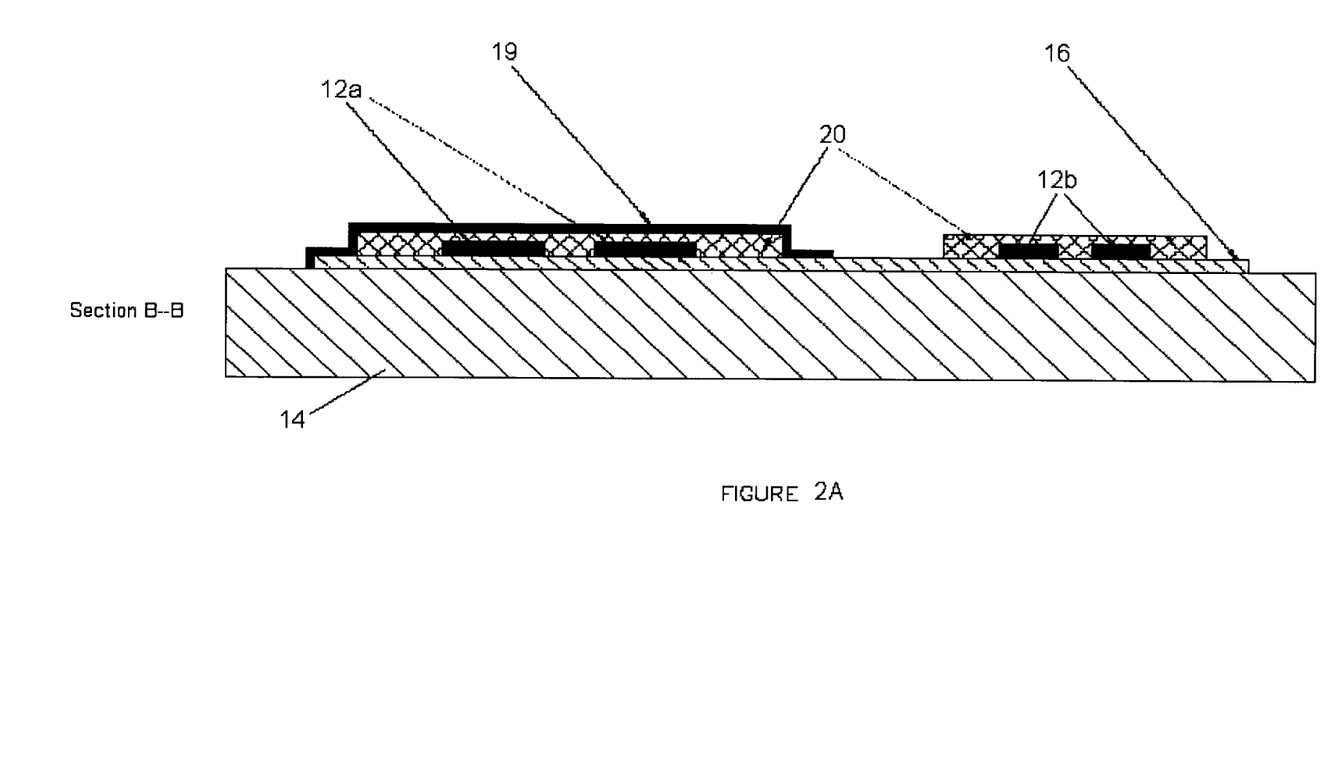
FIGS. 2A–D are cross-sectional views of embodiments of a Head Gimbal Assembly in accordance with the invention.
Figure 2B:
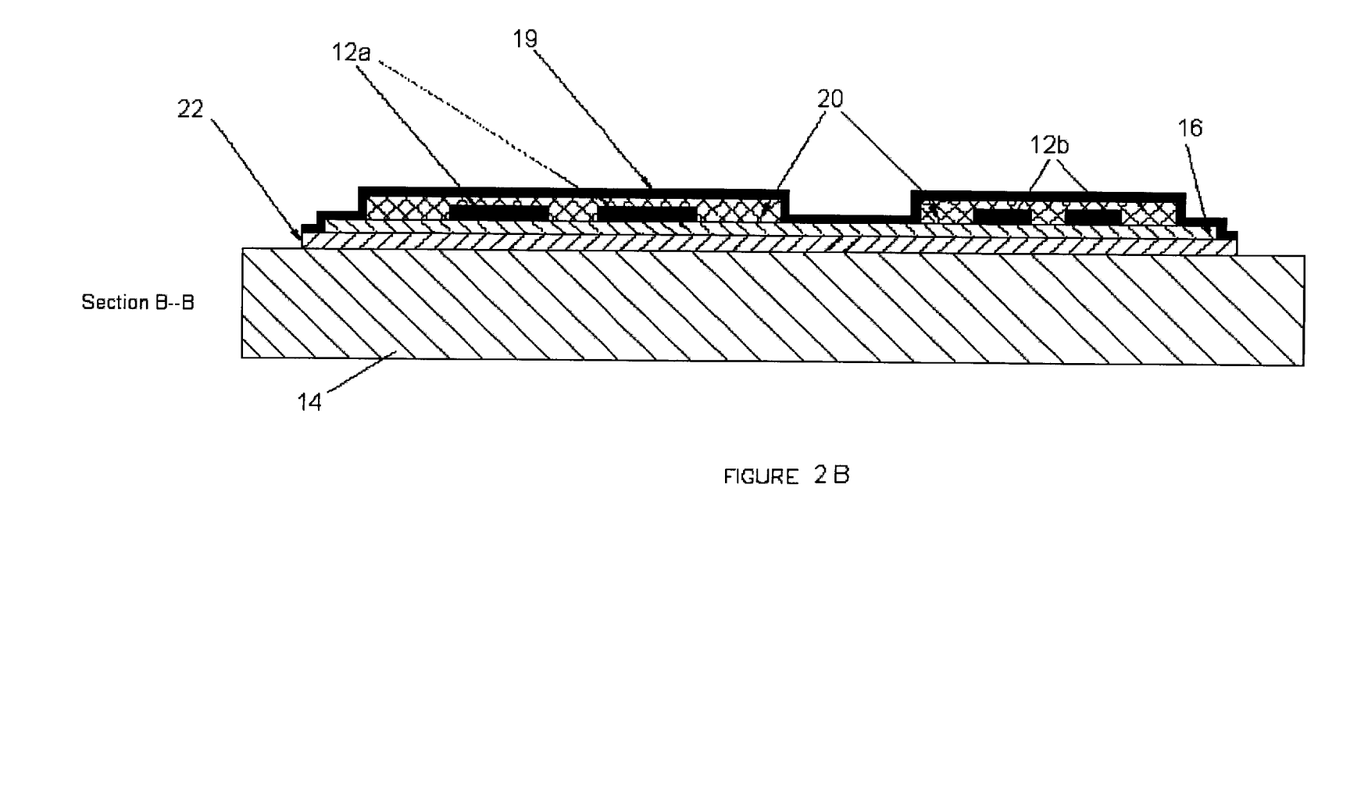

FIGS. 2A–D are cross-sectional views of various embodiments of the present invention taken at line B—B of the HGA 1 of FIG. 1. As shown in FIG. 2A, a dielectric layer 16 is disposed between the conductor array 11 (shown by pairs 12*a* and 12*b*) and the conductive substrate 14. In the preferred embodiment, the dielectric layer 16 is of a polyimide composition characterized by a thickness in the range of 10–18 microns. The conductive substrate is stainless steel. The conductor array 11 is disposed on the dielectric layer 16 in the form of a pair of read-paths 12*a* and a pair of write-paths 12*b*. In the preferred embodiment, each pair of read-paths 12*a* and write-paths 12*b* is characterized by a thickness of 10–25 microns. A protective layer 20 is then disposed atop the conductor array 11 and covering at least one of the pairs 12*a* and 12*b*. In the embodiment shown in FIG. 2A, the protective layer 20 covers both of the pairs 12*a* and 12*b*. In a preferred embodiment, the protective layer 20 is of a polyimide composition characterized by a thickness in the range of 15–40 microns. The anti-static coating 19 is then disposed atop the protective layer 20 so to cover at least one of the pairs 12*a* and 12*b*, such as covering the pair of read-paths 12*a* as shown in FIG. 2A, and covering of both pairs 12*a* and 12*b* as shown in FIG. 2B. In preferred embodiments of the present invention as shown in FIGS. 2A–D, the anti-static coating 19 is of a polymer composition, such as ST-Poly™ manufactured by Central Corporation or AS-21 developed by Hutchinson Technologies. In the preferred embodiments of the present invention in which the anti-static coating 19 is disposed atop the protective layer 20, such as those in FIGS. 2A–C, the anti-static coating 19 is characterized by a thickness of in the range 10–100 nanometers.

FIG. 2B is a cross-sectional view of another embodiment of the HGA 1 of the present invention taken at line B—B of FIG. 1. As shown in FIG. 2B, a conductive backing layer 22 is disposed between the conductive substrate 14 and the dielectric layer 16. In a preferred embodiment, the conductive backing layer is stainless steel characterized by a thickness of 20 microns. In another preferred embodiment, the conductive backing layer is copper a composition, such as a copper alloy, characterized by a thickness of 5 microns. In a preferred embodiment, the conductive backing layer 22 extends outside of the area covered by the conductive substrate 14 and all the way to the distal end 15 of the HGA 1. In the preferred embodiment, the conductive backing layer 22 is disposed based on a predetermined pattern, such as a predetermined windowing pattern, such as in the form of conductive backing layers 22 and window 23 shown in FIG. 2C. In the preferred embodiment, the determination of the patterning features is based on impedance and time delay considerations in optimizing the conductor array 11.

Figure 2C:
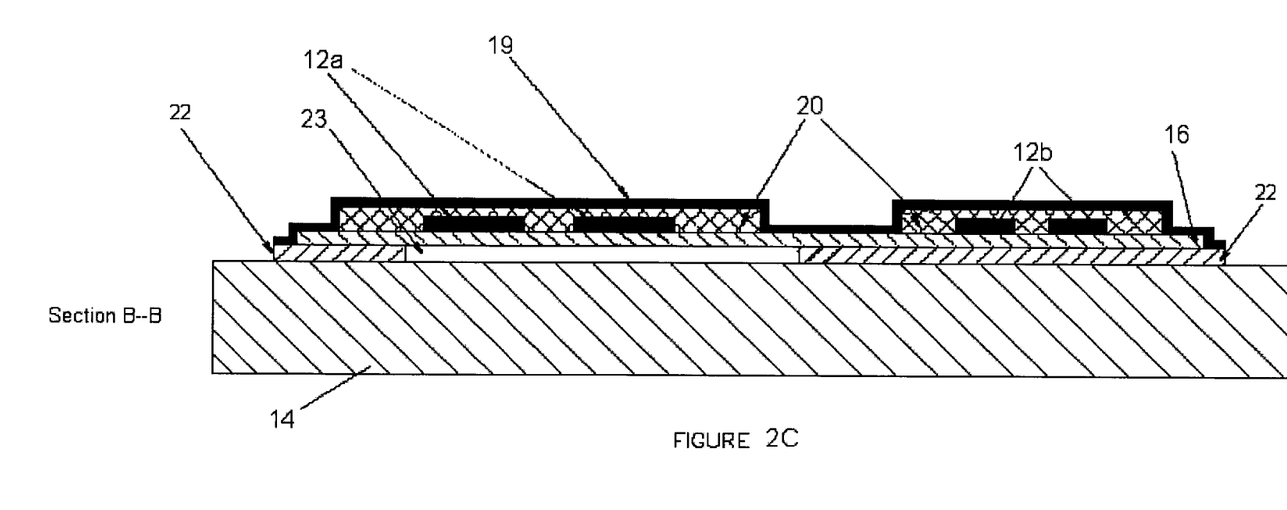
Figure 2D:
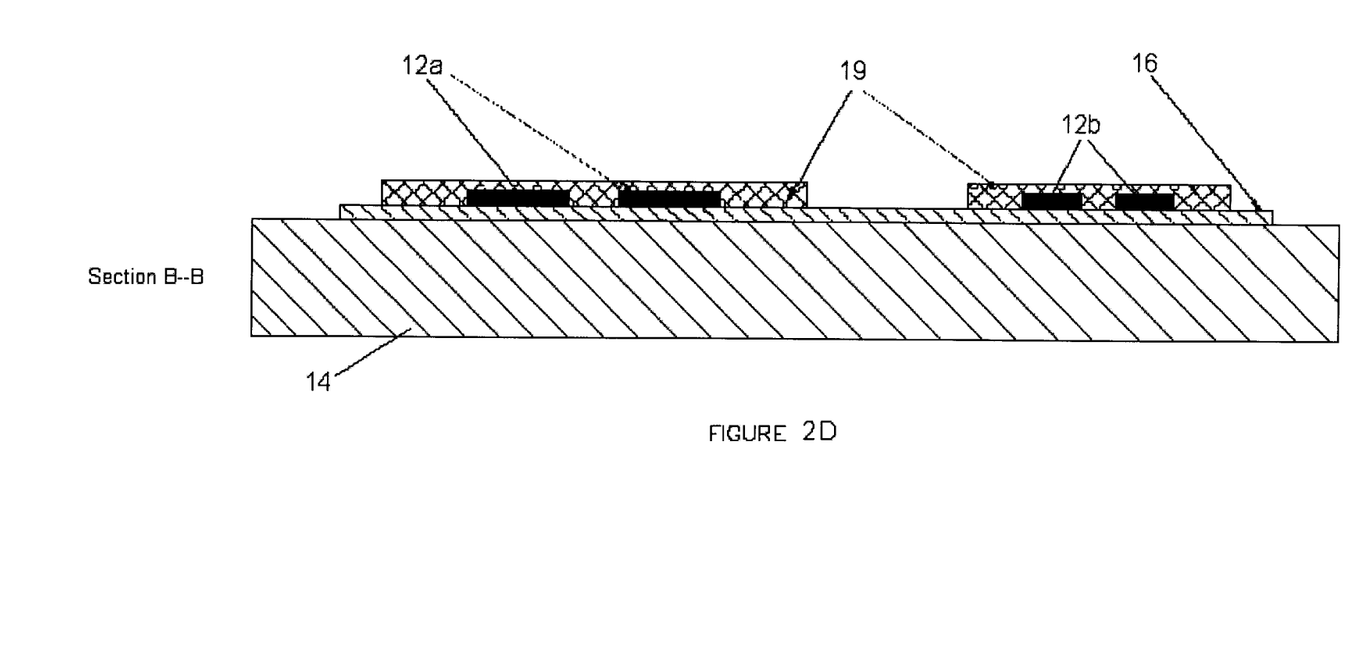

FIG. 2D is a cross-sectional view of another embodiment of the HGA 1 of the present invention taken at line B—B of FIG. 1. As shown in FIG. 2D, in this preferred embodiment of the present invention, the anti-static coating 19 is disposed adjacent to at least one of the pairs 12*a* and 12*b* of the conductor array 11, and used in lieu of the protective layer 20 employed in the preferred embodiments shown in FIGS. 2A–C. In this preferred embodiment of the present invention in which the anti-static coating 19 is disposed adjacent to the conductor array 11, the anti-static coating 19 is characterized by a thickness in the range of 15–40 microns. As also shown in FIG. 2D, a dielectric layer 16 is disposed between the conductor array 11 and the conductive substrate 14. It should be noted that the patterned conductive backing layer 22 described in conjunction with the preferred embodiments of FIGS. 2B–C can also be readily used in conjunction with the preferred embodiment of FIG. 2D.

It should also be noted that the various features of the foregoing preferred embodiments as shown in FIGS. 2A–D were discussed separately for clarity of description only and they can be incorporated in whole or in part into a single embodiment of the invention having all or some of these features. For example, the dielectric layer 16 in the HGA 1 may have (1) a conductive backing layer 22 used in an overall configuration such as those of a Trace Suspension Assembly or a grounded Flex Suspension Assembly; or 2) no conductive backing layer 22 used in an overall configuration such as those used in an ungrounded Flex Suspension Assembly.

Figure 3A:
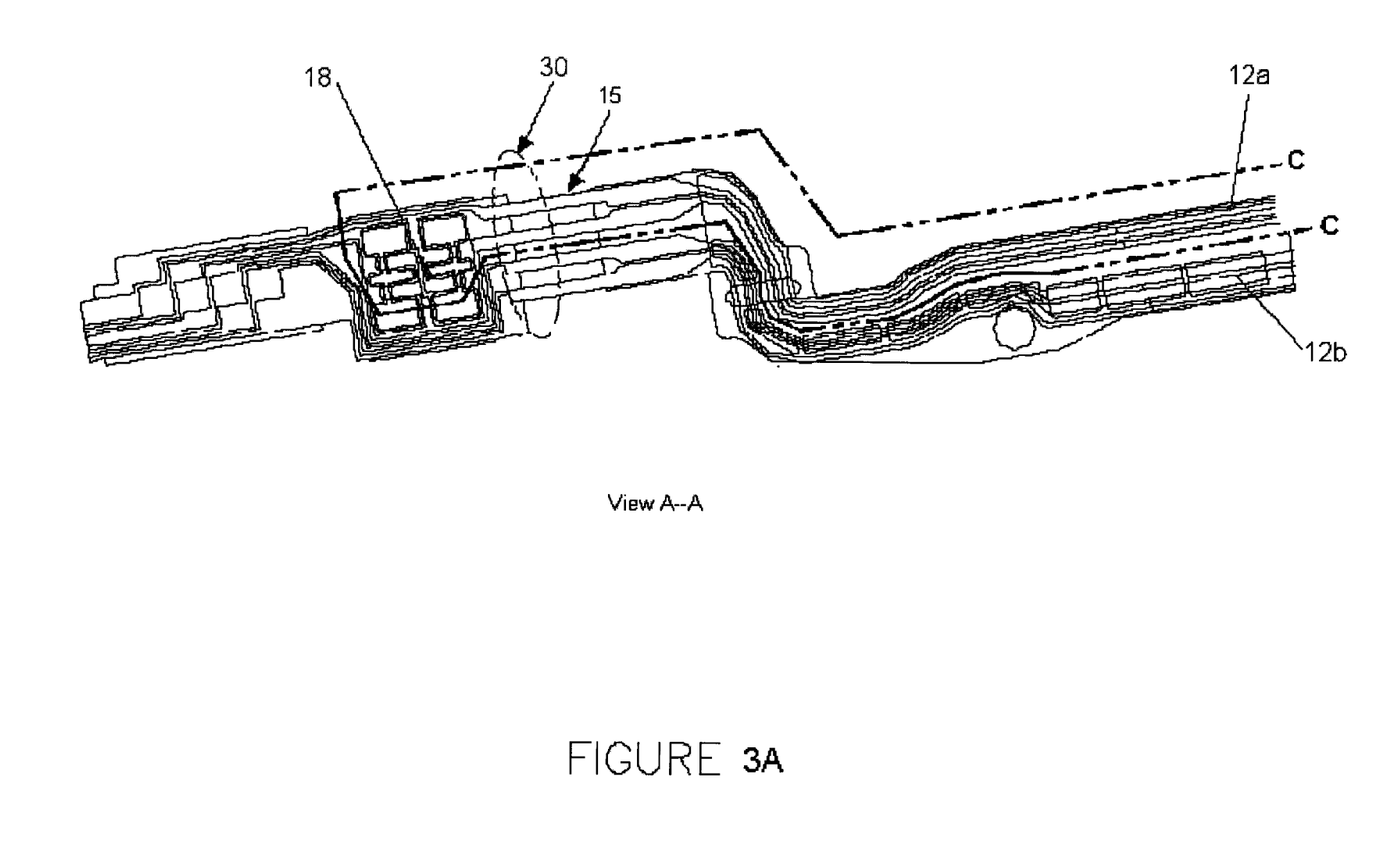
FIGS. 3A–C are magnified views of the distal portion of a Head Gimbal Assembly in accordance with the invention.
Figure 3B:
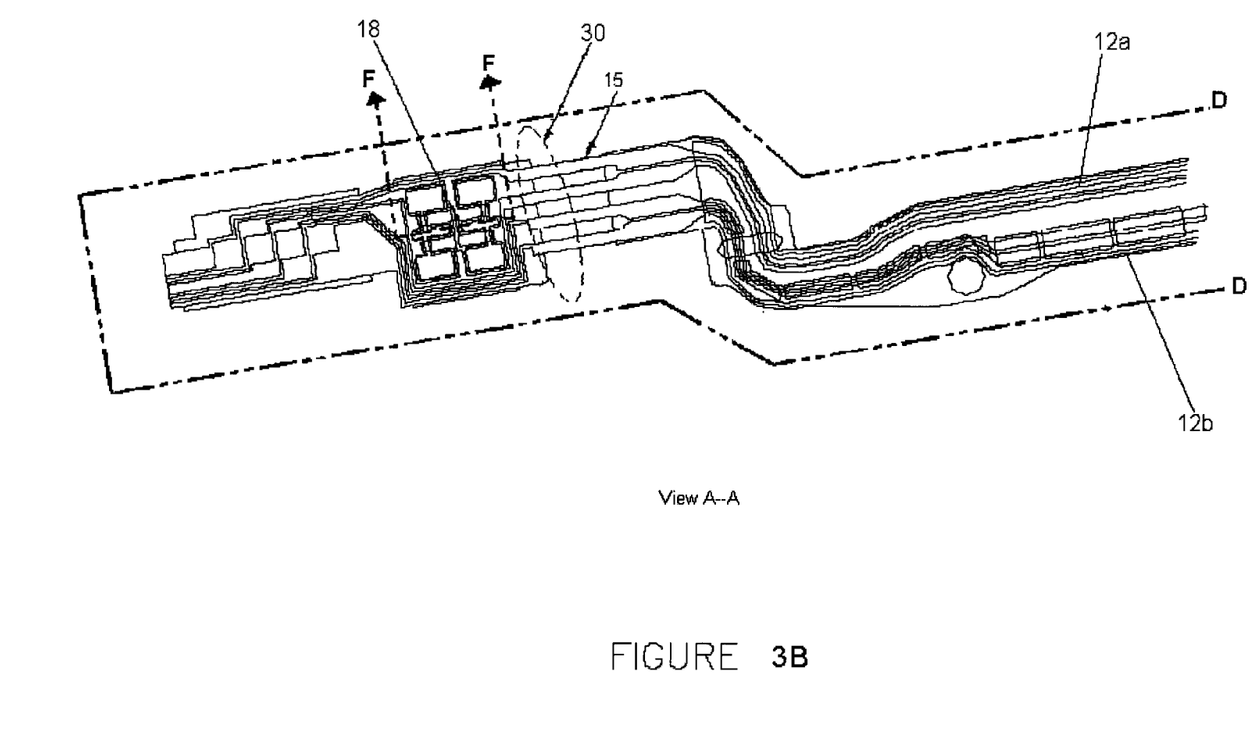
Figure 3C:
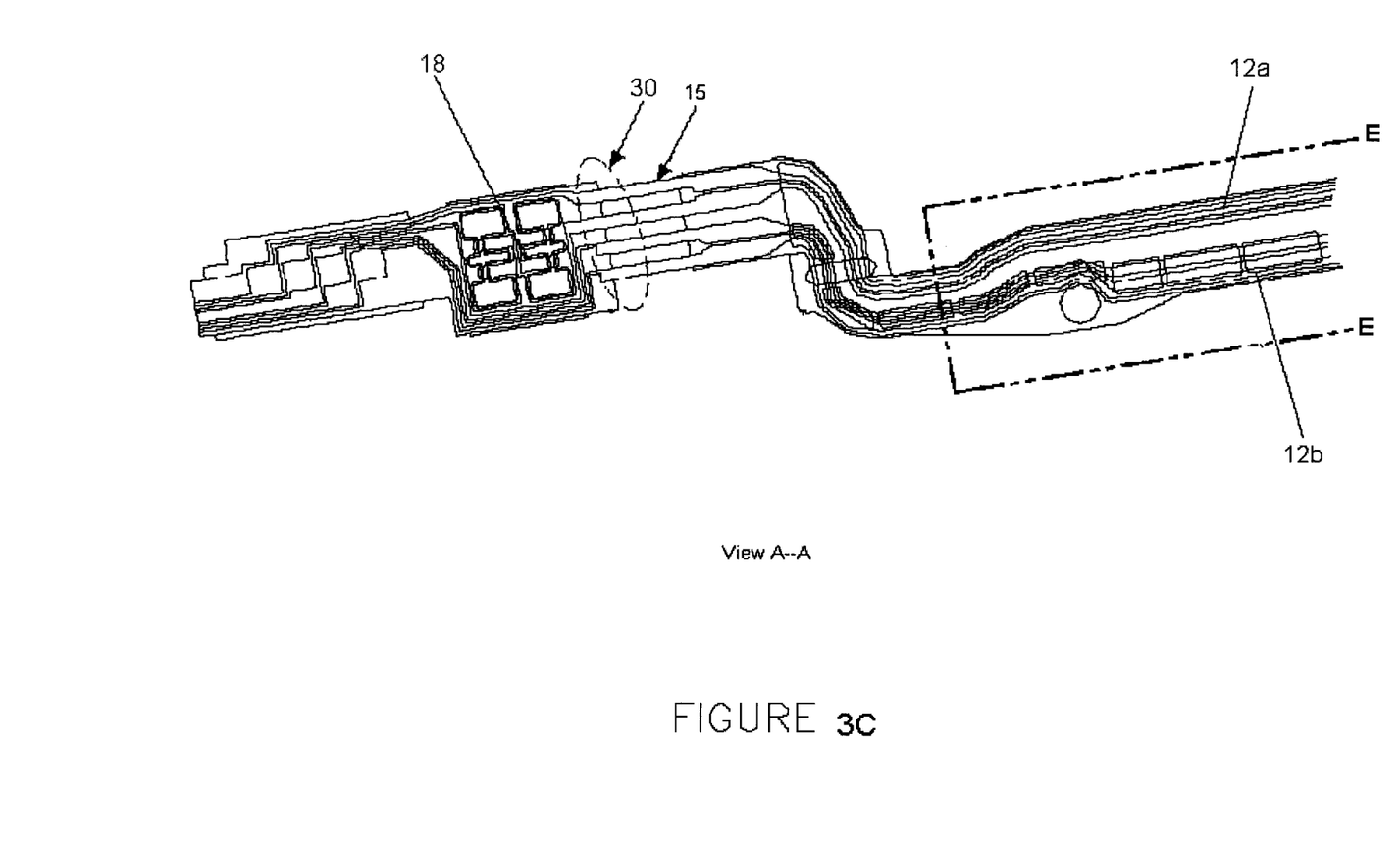

FIGS. 3A–C are magnified views of the distal segment of the various embodiments of HGA 1 as defined by line A—A in FIG. 1. As shown in FIGS. 3A–C the shunt 18 is connected to the distal end 15 via a shunt removal region 30 for removing the shunt, such as by shearing, during a subsequent integration of the HGA 1 into a Head Stack Assembly (not shown). In the preferred embodiments shown in FIGS. 3A–C, the shunt is a switched shunt that can be set to an open position for allowing the electrical testing of the TGA 2 and HGA 1 at various stages of the manufacturing prior to the integration of the HGA 1 into the Head Stack Assembly.

FIG. 3A and FIG. 3B are associated with the preferred embodiments of the present invention shown in FIGS. 2A–C in which the anti-static coating 19 is disposed atop the protective layer 20. In these preferred embodiments in which the anti-static coating 19 is disposed atop the protective layer 20, the anti-static coating 19 is electrically connected to the shunt 18. In these preferred embodiments, the anti-static coating 19 substantially covers the shunt 18, ranging from a partial coverage of the shunt 18, such as covering those portions of the HGA 1 defined by the C—C line shown in FIG. 3A, to a full coverage of the shunt 18, such as covering those portions of the HGA 1 defined by the D—D line shown in FIG. 3B.

FIG. 3C is associated with the preferred embodiments of the present invention described in conjunction with FIG. 2D in which the anti-static coating 19 is disposed adjacent to the conductor array 11, and used in lieu of the protective layer 20 employed in the preferred embodiments shown in FIGS. 2A–C. In these preferred embodiment in which the anti-static coating 19 is disposed adjacent to the conductor array 11, the anti-static coating 19 may be electrically unconnected to the shunt 18. In these preferred embodiments, the anti-static coating 19 coverage of only portions of the HGA 1 such as those substantially defined by the E—E line shown in FIG. 3C will suffice for affording protection against ESD and EOS events in accordance with the present invention.

Figure 4:
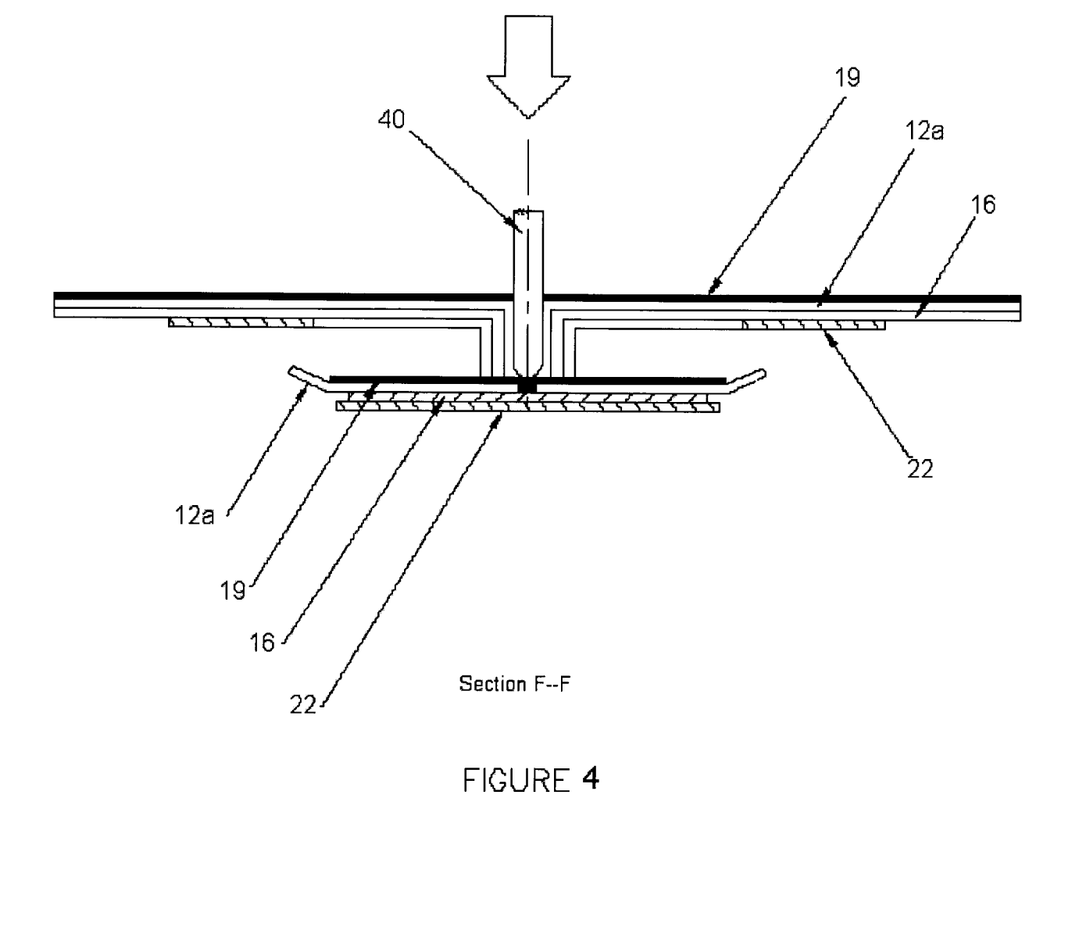
FIG. 4 is a cross-sectional view of a switched shunt used in the Head Gimbal Assembly in accordance with the invention.

FIG. 4 is a cross-sectional view of a switched shunt 18 used in the HGA 1 of the present invention and taken at line F—F of FIG. 3B, in which the shunt is covered by the anti-static coating 19. As shown, a de-shunt pin 40, is inserted into the switched shunt 18 to set the switched shunt into an open position. Setting the shunt 18 to an open position, combined with the finite non-zero resistance characteristics of the anti-static coating 19 makes it possible for conducting of electrical testing, such as a Dynamic Electrical Testing (DET), of the TGA 2 and HGA 1 at various stages of the manufacturing prior to the integration of the HGA 1 into the Head Stack Assembly.

It should be noted that in the foregoing preferred embodiments of the present inventions, the anti-static coating 19 may be advantageously applied to only predetermined portions of the conductor array 11 based on a predetermined coverage pattern. The coverage pattern is based on one or more considerations such as the overall mass, material thickness and the ease of manufacturability of the anti-static coating 19 as affecting the mechanical performance of the HGA 1 during the operation of the disk drive. One advantage of the foregoing features of the present invention over the prior art is that by using a shunt 18 in conjunction with the anti-static coating 19 in the manners described above, the range of effectives of the shunt 18 is virtually extended over substantially the entire span of the HGA 1 and therefore the HGA 1 is effectively protected from the unbalanced accumulation of the electrostatic charge leading to ESD or EOS events throughout the entire Head Stack Assembly manufacturing process.

What is claimed is:

1. A Trace Gimbal Assembly (TGA) for use in a disk drive and attachable to a head having a read element and a write element, the TGA comprising:
   a conductor array having a first end connectable to the read element and the write element and a distal end for connecting the read element and the write element to a signal processing circuit, the conductor array further comprising:
     a pair of read-paths connectable to the read element for electrically connecting the head to a shunt; and
     a pair of write-paths connectable to the write element,
   a conductive substrate for supporting the head and the conductor array;
   a dielectric layer disposed between the conductor array and the conductive substrate;
   the shunt connected at the distal end for shunting the read element; and
   an anti-static coating, covering a substantial portion of the conductor array for neutralizing electrostatic charge accumulation on the conductor array,
   wherein the anti-static coating is disposed adjacent to the conductor array and substantially covers at least one of the pairs, and
   wherein the anti-static coating is characterized by a thickness in the range of 15–40 microns.

2. A TGA as defined in claim 1, further comprising:
   a protective layer disposed atop the conductor array and covering at least one of the pairs of read-paths and write-paths,
   wherein the anti-static coating is disposed atop the protective layer.

3. A TGA as defined in claim 2, wherein the anti-static coating is electrically connected to the shunt and substantially covers the shunt.

4. A TGA as defined in claim 2, wherein the protective layer comprise a polyimide composition characterized by a thickness in the range of 15–40 microns.

5. A TGA as defined in claim 1, wherein the anti-static coating is a low resistivity dielectric coating characterized by a resistance in the range of 10 kilo-ohms to 100 kilo-ohms.

6. A TGA as defined in claim 5, wherein the anti-static coating is of a polymer composition.

7. A TGA as defined in claim 1, wherein the conductive substrate comprise stainless steel.

8. A TGA as defined in claim 1, wherein the dielectric layer comprise a polyimide composition characterized by a thickness in the range of 10–18 microns.

9. A TGA as defined in claim 1 wherein each pair of read-paths and write-paths is characterized by a thickness in the range of 10–25 microns.

10. A TGA as defined in claim 1, wherein the conductive substrate is a load beam.

11. A TGA as defined in claim 1, wherein the shunt is a switched shunt.

12. A TGA as defined in claim 1, wherein the shunt is connected to the distal end via a shunt removal region for removing the shunt during a subsequent integration of the TGA into a Head Stack Assembly.

13. A TGA as defined in claim 1, further comprising:
   a conductive backing layer disposed between the conductive substrate and the dielectric layer based on a predetermined pattern.

14. A TGA as defined in claim 13, wherein the conductive backing layer comprise stainless steel and is characterized by a thickness of 20 microns.

15. A TGA as defined in claim 13, wherein the conductive backing layer comprise copper and is characterized by a thickness of 5 microns.

16. A TGA as defined in claim 1, wherein the anti-static coating covers predetermined portions of the conductor array based on a predetermined coverage pattern based on considerations of at least the mass and manufacturability of the anti-static coating.

17. A Head Gimbal Assembly (HGA) for use in a disk drive, the HGA comprising:
   a) a head comprising a read element and a write element; and
   b) a Trace Gimbal Assembly (TGA) attached to the head, comprising:
      a conductor array having a first end connected to the read element and the write element and a distal end for connecting the read element and the write element to a signal processing circuit, the conductor array further comprising:
        a pair of read-paths connected to the read element for electrically connecting the head to a shunt; and
        a pair of write-paths connected to the write element,
      a conductive substrate supporting the head and the conductor array;

a dielectric layer disposed between the conductor array and the conductive substrate;

the shunt connected at the distal end for shunting the read element; and an anti-static coating covering a substantial portion of the conductor array for neutralizing electrostatic charge accumulation on the conductor array, wherein the anti-static coating is disposed adjacent to the conductor array and substantially covers at least one of the pairs, and wherein the anti-static coating is characterized by a thickness in the range of 15–40 microns.

18. A HGA as defined in claim 17, further comprising:

a protective layer disposed atop the conductor array and covering at least one of the pairs of read-paths and write-paths, wherein the anti-static coating is disposed atop the protective layer.

19. A HGA as defined in claim 18, wherein the anti-static coating is electrically connected to the shunt and substantially covers the shunt.

20. A HGA as defined in claim 18, wherein the protective layer comprise a polymide composition characterized by a thickness in the range of 15–40 microns.

21. A HGA as defined in claim 17, wherein the anti-static coating is a low resistivity dielectric coating characterized by a resistance in the range of 10 kilo-ohms to 100 kilo-ohms.

22. A HGA as defined in claim 21, wherein the anti-static coating is of a polymer composition.

23. A HGA as defined in claim 17, wherein the conductive substrate comprise stainless steel.

24. A HGA as defined in claim 17, wherein the dielectric layer comprise a polyimide composition characterized by a thickness in the range of 10–18 microns.

25. A HGA as defined in claim 17 wherein each pair of read-paths and write-paths is characterized by a thickness in the range of 10–25 microns.

26. A HGA as defined in claim 17, wherein the conductive substrate is a load beam.

27. A HGA as defined in claim 17, wherein the shunt is a switched shunt.

28. A HGA as defined in claim 17, wherein the shunt is connected to the distal end via a shunt removal region for removing the shunt during a subsequent integration of the HGA into a Head Stack Assembly.

29. A HGA as defined in claim 17, further comprising:

a conductive backing layer disposed between the conductive substrate and the dielectric layer based on a predetermined pattern.

30. A HGA as defined in claim 29, wherein the conductive backing layer comprise stainless steel and is characterized by a thickness of 20 microns.

31. A HGA as defined in claim 29, wherein the conductive backing layer comprise copper and is characterized by a thickness of 5 microns.

32. A HGA as defined in claim 17, wherein the anti-static coating covers predetermined portions of the conductor array based on a predetermined coverage pattern based on considerations of at least the mass and manufacturability of the anti-static coating.

33. A HGA as defined in claim 17, wherein the head is mounted on a gimbal.

* * * * *